(12) United States Patent
Sun

(10) Patent No.: US 9,881,942 B2
(45) Date of Patent: Jan. 30, 2018

(54) ARRAY SUBSTRATE, MANUFACTURING METHOD THEREOF AND DISPLAY DEVICE

(71) Applicant: BOE Technology Group Co., Ltd., Beijing (CN)

(72) Inventor: Shuang Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 207 days.

(21) Appl. No.: 14/407,707

(22) PCT Filed: Dec. 5, 2013

(86) PCT No.: PCT/CN2013/088628
§ 371 (c)(1),
(2) Date: Dec. 12, 2014

(87) PCT Pub. No.: WO2015/043069
PCT Pub. Date: Apr. 2, 2015

(65) Prior Publication Data
US 2016/0276377 A1     Sep. 22, 2016

(30) Foreign Application Priority Data

Sep. 27, 2013 (CN) .......................... 2013 1 0452517

(51) Int. Cl.
H01L 29/82 (2006.01)
H01L 27/12 (2006.01)
(Continued)

(52) U.S. Cl.
CPC ........ *H01L 27/1259* (2013.01); *H01L 27/124* (2013.01); *H01L 27/1248* (2013.01);
(Continued)

(58) Field of Classification Search
CPC ............. H01L 27/1259; H01L 27/1248; H01L 29/7869; H01L 29/66765; H01L 29/78669;
(Continued)

(56) References Cited

U.S. PATENT DOCUMENTS 7,663,723 B2 * 2/2010 Kim .................. G02F 1/134363
349/106
2008/0055508 A1 * 3/2008 Yoshimoto ............ G02F 1/1368
349/43
(Continued)

FOREIGN PATENT DOCUMENTS

CN     101140397 A     3/2008
CN     101369081 A     2/2009
(Continued)

OTHER PUBLICATIONS

International Search Report and Written Opinion dated Jul. 21, 2014 (PCT/CN2013/088628); ISA/CN.
(Continued)

*Primary Examiner* — Cuong Q Nguyen
*Assistant Examiner* — Nishath Yasmeen
(74) *Attorney, Agent, or Firm* — Banner & Witcoff, Ltd.

(57) ABSTRACT

A method for manufacturing an array substrate, comprising forming a pattern of a gate electrode by one pattering process; forming a gate insulating layer on a substrate provided with the pattern of the gate electrode; forming first and second patterns thereon, in which the first pattern corresponds to a pattern of a semiconductor active layer and the second pattern corresponds to a source electrode and a drain electrode; forming a pattern layer including an opening area on the substrate provided with the second pattern, in which the opening area corresponds to a gap between the source electrode and the drain electrode, the minimum width
(Continued)

thereof being greater than the width of the gap between the source electrode and the drain electrode, and at least forming a pattern of the source electrode and the drain electrode and a pixel electrode electrically connected with the drain electrode through the opening area.

16 Claims, 8 Drawing Sheets

(51) Int. Cl.
  *H01L 29/66* (2006.01)
  *H01L 29/786* (2006.01)
(52) U.S. Cl.
  CPC .... *H01L 29/66765* (2013.01); *H01L 29/7869* (2013.01); *H01L 29/78669* (2013.01); *H01L 27/1288* (2013.01)
(58) Field of Classification Search
  CPC .............. H01L 27/124; H01L 27/1288; H01L 27/3246; H01L 27/3248
  See application file for complete search history.

(56) References Cited

U.S. PATENT DOCUMENTS

| 2009/0322657 | A1* | 12/2009 | Na ..................... H01L 27/3246 345/76 |
| 2010/0194707 | A1* | 8/2010 | Hotelling ............. G06F 3/0412 345/173 |
| 2011/0032460 | A1* | 2/2011 | Lee .................... G02F 1/133555 349/114 |
| 2012/0038873 | A1* | 2/2012 | Kim ................... G02F 1/133512 349/138 |
| 2013/0032804 | A1 | 2/2013 | Kim et al. |

FOREIGN PATENT DOCUMENTS

| CN | 102569192 A | 7/2012 |
| CN | 202888179 U | 4/2013 |
| CN | 103325792 A | 9/2013 |
| CN | 203456460 U | 2/2014 |
| JP | 2008216608 A | 9/2008 |
| KP | 1020070046226 | * 9/2008 |

OTHER PUBLICATIONS

Mar. 29, 2016—International Preliminary Report on Patentability Appn PCTCN2013088628.

Jun. 1, 2015—(CN)—First Office Action for Appn 201310452517.X with Eng Tran.

Nov. 2, 2015—(CN)—Second Office Action Appn 201310452517.X with English Tran.

* cited by examiner

ARRAY SUBSTRATE, MANUFACTURING METHOD THEREOF AND DISPLAY DEVICE

The application is a U.S. National Phase Entry of International Application PCT/CN2013/088628 filed on Dec. 5, 2013, designating the United States of America and claiming priority to Chinese Patent Application No. 201310452517.X, filed on Sep. 27, 2013. The present application claims priority to and the benefit of the above-identified applications and the above-identified applications are incorporated by reference herein in their entirety.

TECHNICAL FIELD

Embodiments of the present invention relate to an array substrate, a manufacturing method thereof and a display device.

BACKGROUND

Thin-film transistor liquid crystal displays (TFT-LCDs) have dominated the field of flat-panel display technology due to the characteristics of small volume, low power consumption, non-radiation and the like and hence is widely favored by people.

In the conventional method for manufacturing an array substrate, in order to reduce the number of patterning processes, a half-tone mask process is applied to form a semiconductor active layer and source/drain electrodes in one patterning process. Therefore, the process difficulty will be increased, and hence the performance of a thin-film transistor (TFT) may become instable.

In addition, in order to optimize the performances of the array substrate and increase the flatness, at least one pattern layer with other specific function is usually arranged in the array substrate. However, in the process of forming the pattern layer with other specific function, a corresponding number of patterning processes must also be performed. Moreover, each patterning process respectively includes processes such as film forming, exposing, developing, etching and stripping.

SUMMARY

Embodiments of the present invention provide an array substrate, a manufacturing method thereof and a display device, which can avoid the use of half-tone mask process, simplify the process difficulty and save the cost.

An aspect of the invention provides an array substrate, comprising a thin-film transistor (TFT), a pixel electrode and a pattern layer disposed between a source electrode and a drain electrode of the TFT and the pixel electrode. The pattern layer includes an opening area corresponding to a gap between the source electrode and the drain electrode; the minimum width of the opening area is greater than a width of the gap between the source electrode and the drain electrode and at least a portion of the drain electrode of the TFT is exposed by the opening area; and the pixel electrode is electrically connected with the drain electrode exposed by the opening area.

For example, the pattern layer includes a transparent organic insulating layer and an adhesion layer disposed beneath the transparent organic insulating layer.

For example, the array substrate may further comprise a passivation layer and a common electrode disposed on the pixel electrode in sequence, both the adhesion layer and the transparent organic insulating layer include the opening area.

For example, the array substrate may further comprise a common electrode and a passivation layer disposed between the transparent organic insulating layer and the pixel electrode in sequence; the adhesion layer, the transparent organic insulating layer and the passivation layer all include the opening area.

For example, the array substrate may further comprise a common electrode arranged on a same layer as and alternately with pixel electrode; both the adhesion layer and the transparent organic insulating layer include the opening area.

For example, the array substrate may further comprise a transparent electrode retained pattern arranged on the same layer as the pixel electrode; the transparent electrode retained pattern at least corresponds to the source electrode and is disposed on the source electrode; the source electrode of the TFT is also exposed by the opening area; and the transparent electrode retained pattern is electrically connected with the source electrode exposed by the opening area.

For example, the array substrate may further comprise a data line; the data line is electrically connected with the transparent electrode retained pattern and/or the source electrode.

For example, the TFT includes a semiconductor active layer, and the semiconductor active layer includes an amorphous silicon layer and an n+ amorphous silicon layer; or the semiconductor active layer includes a metal oxide semiconductor active layer.

For example, the TFT is a bottom-gate TFT.

Another aspect of the invention provides a display device, comprising any of the above array substrates.

Still another aspect of the invention provides a method for manufacturing an array substrate, comprising: forming a pattern of a gate electrode on a base substrate by one patterning process; forming a gate insulating layer on the substrate provided with the pattern of the gate electrode; forming a first pattern and a second pattern disposed on the first pattern by one patterning process on the substrate provided with the gate insulating layer, wherein the first pattern corresponds to a pattern of a semiconductor active layer and the second pattern corresponds to a source electrode and a drain electrode to be formed; forming a pattern layer including an opening area on the substrate provided with the second pattern, wherein the opening area corresponds to a gap between the source electrode and the drain electrode to be formed, the minimum width of the opening area is greater than a width of the gap between the source electrode and the drain electrode, and a portion of the drain electrode is exposed by the opening area; and at least forming a pattern of the source electrode and the drain electrode and a pixel electrode on the substrate provided with the pattern layer by one patterning process, wherein the pixel electrode is electrically connected with the drain electrode exposed by the opening area.

For example, the pattern layer includes an adhesion layer and a transparent organic insulating layer.

For example, an adhesion layer film and a transparent organic insulating layer film are formed in sequence on the substrate provided with the second pattern, and are subjected to one patterning process to form the adhesion layer and the transparent organic insulating layer including the opening area.

For example, after at least forming the pattern of the source electrode and the drain electrode and the pixel electrode, the method further comprises: forming a passivation layer and a common electrode in sequence.

For example, before at least forming a pattern of the source electrode and the drain electrode and a pixel electrode and after forming the adhesion layer and the transparent organic insulating layer including the opening area, the method further comprises: forming a common electrode by one patterning process; and forming a passivation layer film on the substrate provided with the common electrode and forming a passivation layer, including the opening area, by one patterning process.

For example, before at least forming a pattern of the source electrode and the drain electrode and a pixel electrode, the method further comprises: forming a common electrode by one patterning process; and forming a passivation layer film on the substrate provided with the common electrode; the adhesion layer, the transparent organic insulating layer and a passivation layer, including the opening area, are formed on the substrate provided with the second pattern.

For example, before the common electrode and the passivation layer film are formed, an adhesion layer film and a transparent organic insulating layer film are formed on the substrate provided with the second pattern in sequence, the transparent organic insulating layer film is subjected to one patterning process, and the transparent organic insulating layer includes the opening area being formed; and after the common electrode and the passivation layer film are formed, the adhesion layer and the passivation layer, including the opening area, are formed by performing one patterning process on the adhesion layer film and the passivation layer film.

For example, a common electrode arranged on a same layer as and alternately with pixel electrode is also formed at the same time when the pixel electrode is formed.

For example, the passivation layer is formed on the substrate provided with the pixel electrode; and subsequently, a common electrode is formed on the passivation layer.

For example, a transparent electrode retained pattern is also formed at the same time when the pattern of the source electrode and the drain electrode and the pixel electrode are at least formed by one patterning process; and the transparent electrode retained pattern at least corresponds to the source electrode, is disposed on the source electrode, and is electrically connected with a portion of the source electrode exposed by the opening area.

For example, the method further comprises a through hole for connecting the data line and the transparent electrode retained pattern; the transparent electrode retained pattern corresponds to both the source electrode and the data line and is electrically connected with the data line via the through hole formed on the data line.

The method for manufacturing the array substrate, provided by the embodiment of the present invention, can effectively simplify the process difficulty on the basis of avoiding the use of the half-tone mask process, and hence can save the cost.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

REFERENCE SIGNS

10—Array Substrate; 20—TFT; 20a—First Pattern; 20b—Second Pattern; 201—Gate Electrode; 202—Gate Insulating Layer; 203—Semiconductor Active Layer; 204—

Source Electrode; 205—Drain Electrode; 300—Adhesion Layer Film; 30—Adhesion Layer; 400—Transparent Organic Insulating Layer Film; 40—Transparent Organic Insulating Layer; 50—Pixel Electrode; 60—Transparent Electrode Retained Pattern; 70—Passivation Layer; 80—Common Electrode; 90—Opening Area.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Figure 1:
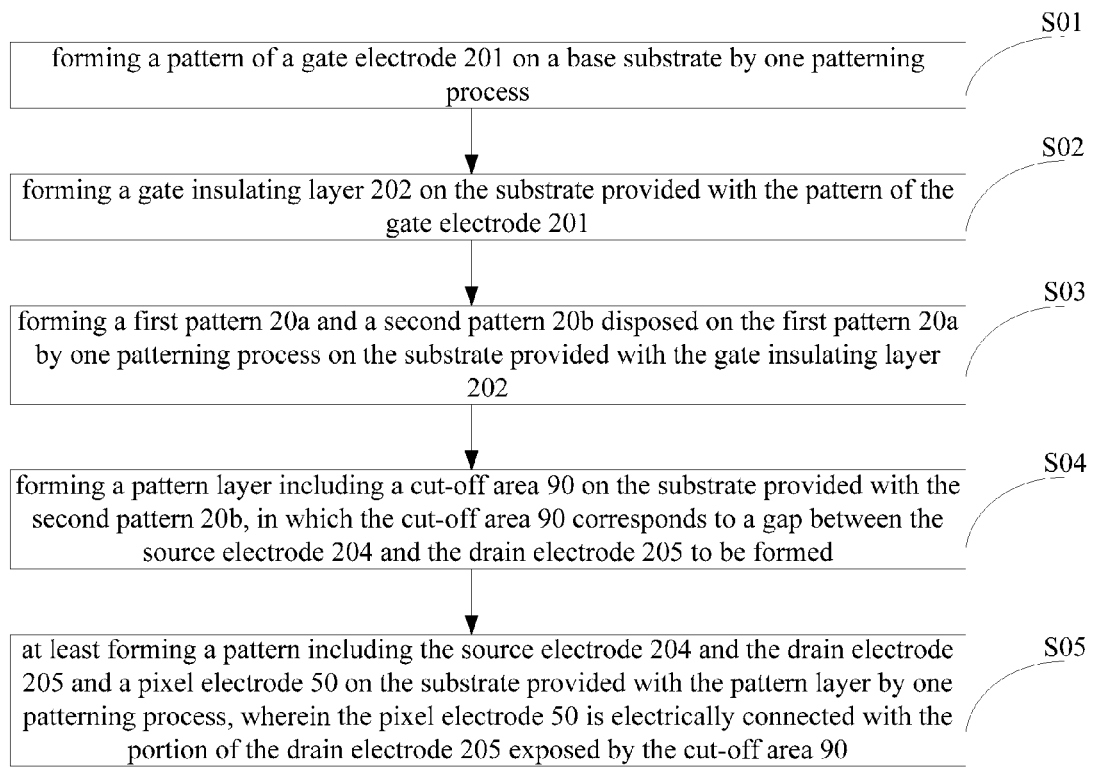
FIG. 1 is a process chart of a method for manufacturing an array substrate, provided by an embodiment of the present invention.

An embodiment of the present invention provides a method for manufacturing an array substrate 10. As illustrated in FIG. 1, the method may be conducted as follows.

S01: forming a pattern of a gate electrode 201 on a base substrate by one patterning process.

S02: forming a gate insulating layer 202 on the substrate provided with the pattern of the gate electrode 201.

S03: forming a first pattern 20a and a second pattern 20b disposed on the first pattern 20a by one patterning process on the substrate provided with the gate insulating layer 202.

The first pattern 20a corresponds to a pattern of a semiconductor active layer 203, and the second pattern 20b corresponds to a source electrode 204 and a drain electrode 205 to be formed.

S04: forming a pattern layer including an opening area 90 on the substrate provided with the second pattern 20b, in which the opening area 90 corresponds to a gap between the source electrode 204 and the drain electrode 205 to be formed.

Figure 4:
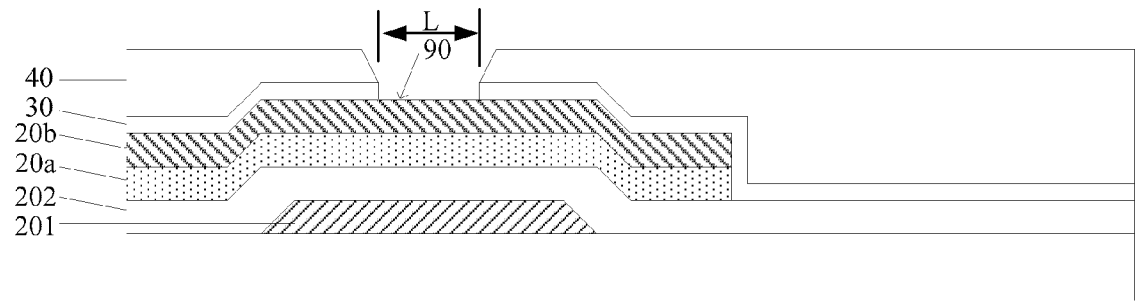
FIG. 4 is a first schematic diagram illustrating a process for forming an opening area, in the method provided by the embodiment of the present invention.
Figure 5A:
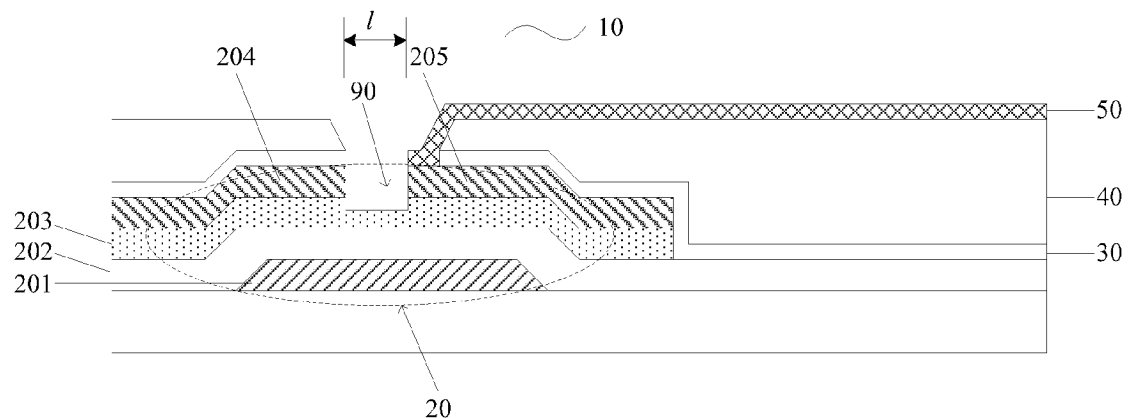
FIG. 5(a) is a first schematic structural view of an array substrate provided by the embodiment of the present invention.
Figure 5B:
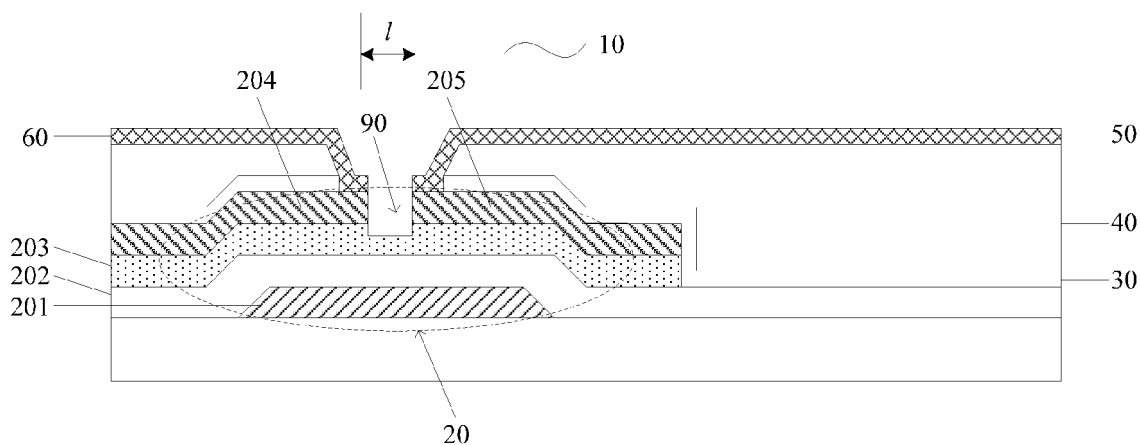
FIG. 5(b) is a second schematic structural view of the array substrate provided by the embodiment of the present invention.

The minimum width "L" (e.g., as shown in FIG. 4) of the opening area 90 is greater than the width "l" (e.g., as shown in FIGS. 5(a) and 5(b)) of the gap between the source electrode 204 and the drain electrode 205. A portion of the drain electrode 205 is at least exposed by the opening area 90.

S05: at least forming a pattern including the source electrode 204 and the drain electrode 205 and a pixel electrode 50 on the substrate provided with the pattern layer by one patterning process, in which the pixel electrode 50 is electrically connected with the portion of the drain electrode 205 exposed by the opening area 90.

The array substrate provided by the embodiment of the present invention comprises a plurality of gate lines and a plurality of data lines which are intercrossed to define pixel units arranged in a matrix. Each pixel unit includes a TFT taken as a switching element and a pixel electrode configured to control the arrangement of liquid crystals. Or the array substrate may further comprise a common electrode. For instance, as for the TFT of each pixel, a gate electrode is electrically connected or integrally formed with corresponding gate lines; a source electrode is electrically connected or integrally formed with corresponding data lines; and a drain electrode is electrically connected or integrally formed with corresponding pixel electrode. The following description mainly aims at a single pixel unit or a plurality of pixel units, but other pixel units may be formed in the same manner.

It should be noted that: firstly, the first pattern 20a corresponding to the pattern of the semiconductor active layer 203 refers to that: the pattern of the semiconductor active layer 203 can be formed only if an etching process is next conducted on the basis of the first pattern 20a, and thus the first pattern 20a corresponds to the pattern of the semiconductor active layer 203 to be formed, and for instance, the semiconductor active layer 203 may include an overlap layer of an amorphous silicon layer and an n+ amorphous silicon layer. Or the first pattern 20a is the pattern of the semiconductor active layer 203, and for instance, the semiconductor active layer 203 includes a metal oxide semiconductor active layer.

Secondly, the number of the pattern layer including the opening area 90 is not limited herein, may be one or more, and may be designed according to the function of the pattern layer in the array substrate.

Thirdly, the case that the opening area 90 corresponds to the gap between the source electrode 204 and the drain electrode 205 and the minimum width L of the opening area 90 is greater than the width l of the gap between the source electrode 204 and the drain electrode 205 refers to that: the projection of the opening area 90 on the base substrate may completely cover the projection of the gap between the source electrode 204 and the drain electrode 205 on the base substrate, and one portion of the drain electrode 205 may be, for instance, at least exposed by the opening area 90.

In the embodiment of the present invention, the pattern layer with specific function is formed, and the pattern layer includes the opening area 90; the portion of the drain electrode 205 of the TFT 20 is at least exposed by the opening area 90; the pixel electrode 50 is electrically connected with the portion of the drain electrode 205 exposed by the opening area 90; and hence the array substrate with a specific structure is formed. In addition, the method for manufacturing the array substrate 10, provided by the embodiment of the present invention, can effectively simplify the process difficulty by avoiding use of a half-tone mask process, and hence can save the cost.

For instance, the pattern layer may include an adhesion layer 30 and a transparent organic insulating layer 40.

The adhesion layer 30 herein is configured to increase the bonding strength between the transparent organic insulating layer 40 and a source/drain metal layer disposed beneath the transparent organic insulating layer 40. The material may be the material for a passivation layer, e.g., silicon nitride.

The transparent organic insulating layer 40 not only can increase the surface flatness of the array substrate 10 but also can reduce the parasitic capacitance of the source electrode 205 or the data line with the pixel electrode 50, and may be prepared by a transparent organic insulating material such as photoresist. Herein, in order to avoid the influence on the transmittance of a display panel, the transparent organic insulating layer 50 is preferably prepared by a transparent organic insulating material with high transmittance.

Of course, the pattern layer may further include other film layers on the basis of different structures of the array substrate 10. In addition, all the film layers include the opening area 90.

Moreover, the specific forming sequence of the opening area 90 may be designed according to the material of the pattern layer and the structure and the manufacturing process of the array substrate 10. The case that the array substrate 10 is formed by minimum pattering processes is preferable.

The method for manufacturing the array substrate 10 may further comprise the following aspects:

First Aspect

Optionally, the adhesion layer 30 and the transparent organic insulating layer 40, including the opening area 90, are formed on the substrate provided with the second pattern 20b. For instance, an adhesion layer film 300 and a transparent organic insulating layer film 400 are formed in sequence on the substrate provided with the second pattern 20b, and the adhesion layer 30 and the transparent organic insulating layer 40, including the opening area 90, are formed by one patterning process.

Thus, one embodiment of the method for manufacturing the array substrate 10 may be conducted as follows.

Figure 2:
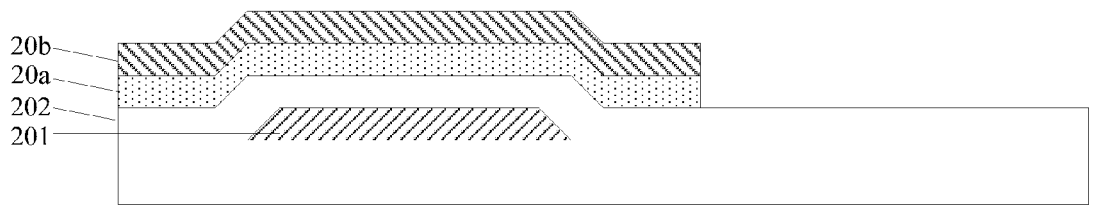
FIG. 2 is a schematic diagram illustrating a process for forming a first pattern and a second pattern, in the method provided by the embodiment of the present invention.

S101: as illustrated in FIG. 2, forming a pattern of a gate electrode 201 on a base substrate by one patterning process, and forming a gate insulating layer 202 on the substrate provided with the pattern of the gate electrode 201.

When the gate electrode 201 is formed, a gate line, a gate line lead and the like may also be formed. Of course, a common electrode line may also be formed.

Herein, for instance, one layer of metal film with the thickness of 1,000 to 7,000 Å may be prepared on the base substrate by a magnetron sputtering process. The metal film may generally be prepared by molybdenum, aluminum, chromium, titanium, tungsten, copper, aluminum-nickel alloy, molybdenum-tungsten alloy, tungsten-copper alloy or other metallic material and may also be prepared by any combination of several aforesaid materials. Subsequently, the gate electrode 201, the gate line (not marked in the figure), the gate line lead and the like are formed via a mask plate by a patterning process including such as exposing, developing, etching and stripping. Subsequently, one layer of insulating film with the thickness of 1,000 to 6,000 Å may be deposited on the substrate provided with the pattern of the gate electrode 201 by chemical vapor deposition (CVD). The insulating film is usually prepared by silicon nitride and may also be prepared by silicon oxide, silicon oxynitride or the like.

S102: as illustrated in FIG. 2, forming an active layer film and a source/drain metal layer film on the substrate obtained after the step S101, and forming a first pattern 20a and a second pattern 20b disposed on the first pattern 20a by one patterning process, in which the first pattern 20a corresponds to a pattern of a semiconductor active layer 203 and the second pattern 20b corresponds to a source electrode 204 and a drain electrode 205 to be formed.

Herein, for instance, the active layer film with the thickness of 1,000 to 6,000 Å and the metal film with the thickness of 1,000 to 7,000 Å may be deposited on the substrate provided with the gate insulating layer 202 by CVD. Subsequently, the first pattern 20a and the second pattern 20b are formed via a mask plate by a patterning process including such as exposing, developing, etching and stripping.

In the case where the active layer film, for instance, includes an amorphous silicon film and an n+ amorphous silicon film, the first pattern 20a corresponds to the pattern of the semiconductor active layer 203 to be formed. In the case where the active layer film is, for instance, a metal oxide semiconductor film, the first pattern 20a is the pattern of the semiconductor active layer 203.

Of course, the process of forming the gate insulating layer 202 on the substrate provided with the pattern of the gate electrode 201 in the step S101 may also be performed before the process of forming the active layer film and the source/drain metal layer film in the step S102.

Figure 3:
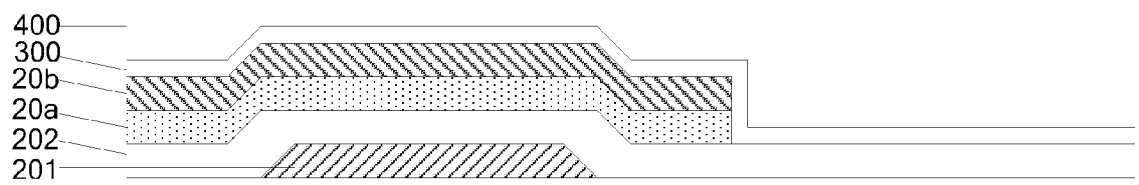
FIG. 3 is a schematic diagram illustrating a process for forming an adhesion layer film and a transparent organic insulating layer film, in the method provided by the embodiment of the present invention.

S103: as illustrated in FIG. 3, forming an adhesion layer film 300 and a transparent organic insulating layer film 400 on the substrate obtained after the step S102; and forming an opening area 90 in both the adhesion layer film 300 and the transparent organic insulating layer film 400 by one patterning process, and obtaining an adhesion layer 30 and a transparent organic insulating layer 40 as shown in FIG. 4.

The opening area 90 corresponds to a gap between the source electrode 204 and the drain electrode 205 to be formed; the minimum width L of the opening area 90 is greater than the width l (e.g., as shown in FIGS. 5(a) and 5(b)) of the gap between the source electrode 204 and the drain electrode 205; and a portion of the drain electrode 205 is at least exposed by the opening area 90.

Herein, for instance, an adhesion layer film 300 with the thickness of 200 to 800 Å and a transparent organic insulating layer film 400 with the thickness of 2,000 to 5,000 Å may be deposited in sequence on the substrate provided with the second pattern 20b by CVD. Subsequently, the adhesion layer 30 and the transparent organic insulating layer 40, including the opening area 90, are formed via a mask plate by a patterning process including such as exposing, developing, etching and stripping.

Herein, the adhesion layer film 300 and the transparent organic insulating layer film 400 may be formed with the opening area 90 by a same patterning process, and of course, may also be formed with the opening area 90 by two patterning processes.

S104: forming a transparent conductive film on the substrate obtained after the step S103, and as illustrated in FIGS. 5(a) and 5(b), at least forming a pattern of the source electrode 204 and the drain electrode 205 and a pixel electrode 50 electrically connected with the drain electrode 205 by one patterning process.

In the case where the active layer film includes the amorphous silicon film and the n+ amorphous silicon film, as illustrated in FIGS. 5(a) and 5(b), the semiconductor active layer 203 is also formed at the same time when the pattern of the source electrode 204 and the drain electrode 205 and the pixel electrode 50 are formed.

Moreover, in this step, as illustrated in FIG. 5(b), a transparent electrode retained pattern 60 may also be formed at the same when the semiconductor active layer 203, the pattern of the source electrode 204 and the drain electrode 205 and the pixel electrode 50 are formed by one patterning process. The transparent electrode retained pattern 60 at least corresponds to the source electrode 204, is disposed on the source electrode 204, and is electrically connected with a portion of the source electrode 204 exposed by the opening area 90.

Herein, for instance, one transparent conductive film layer with the thickness of 100 to 1,000 Å may be deposited on the substrate provided with the adhesion layer 30 and the transparent organic insulating layer 40 by CVD. Subsequently, the pixel electrode 50 is formed via a mask plate by a patterning process including such as exposing, developing, etching and stripping. In addition, the source electrode 204, the drain electrode 205 and the semiconductor active layer 203 are formed. Of course, in another embodiment, the transparent electrode retained pattern 60 may be further formed.

Moreover, a data line is also formed in this step. The data line is connected with the transparent electrode retained pattern 60 and/or the source electrode 204. The data line may be integrally formed with the source electrode 204 or the data line is integrally formed with the transparent electrode retained pattern 60. That is to say, the transparent electrode retained pattern 60 may be independently used as a connecting line for connecting the data line and the source electrode 204 (at this point, the data line and the source electrode 204 are not necessarily manufactured by the same patterning process) and may also be taken as an auxiliary connecting line. For instance, the data line and the source electrode 204 may be integrally connected and may also be connected with each other through the auxiliary connecting line, namely the transparent electrode retained pattern 60, and hence the possibility of breakage can be reduced. Of course, in order to achieve connection, a through hole may be formed at an appropriate position. No limitation will be given here.

Therefore, preferably, when the pattern of the source electrode 204 and the drain electrode 205 is formed, not only the source electrode 204 and the drain electrode 205 are formed but also the data line is formed at the same time.

On this basis, the method may further comprise: forming a through hole for connecting the data line and the transparent electrode retained pattern 60 in the adhesion layer film 300 and the transparent organic insulating layer film 400 formed in the step S103. The transparent electrode retained pattern 60 corresponds to both the source electrode 204 and the data line and is electrically connected with the data line via the through hole formed over the data line.

Thus, for instance, after the data line is disconnected, the data line may be connected with the source electrode 204 through the transparent electrode retained pattern 60 corresponding to the data line.

According to the steps S101 to S104 in the above embodiment, an array substrate 10 comprising the adhesion layer 30 and the transparent organic insulating layer 40 may be manufactured by four patterning processes. In addition, the method for manufacturing the array substrate 10 can avoid the use of the half-tone mask process and hence can simplify the process difficulty and save the cost.

On the basis of the first aspect, moreover, optionally, after the process of at least forming the pattern of the source electrode 204 and the drain electrode 205 and the pixel electrode 50, the method may further comprise: forming a passivation layer 70 and a common electrode 80 in sequence on the pixel electrode 50.

Specifically, on the basis of the step S104, the method for manufacturing the array substrate 10 may also be conducted as follows.

Figure 6A:
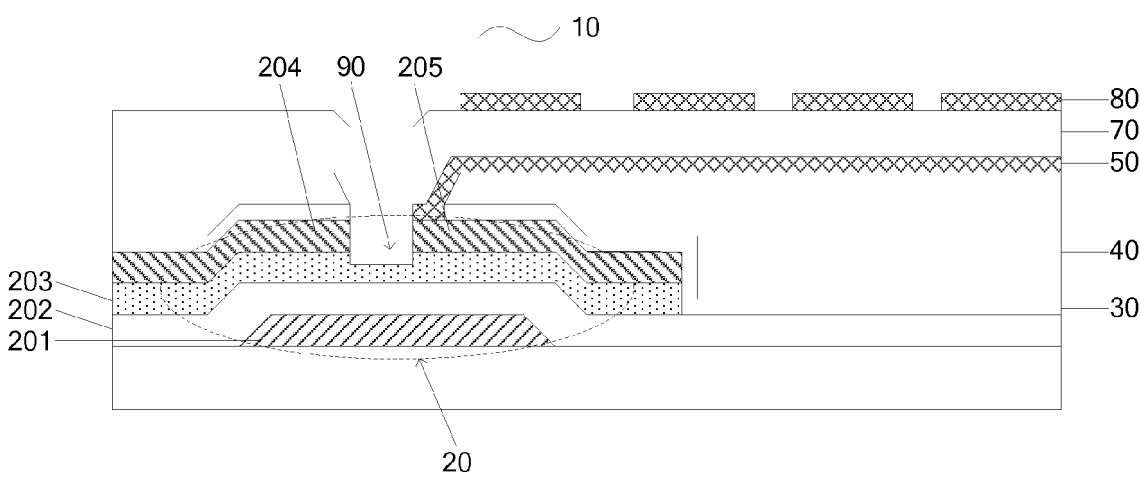
FIG. 6(a) is a third schematic structural view of the array substrate provided by the embodiment of the present invention.
Figure 6B:
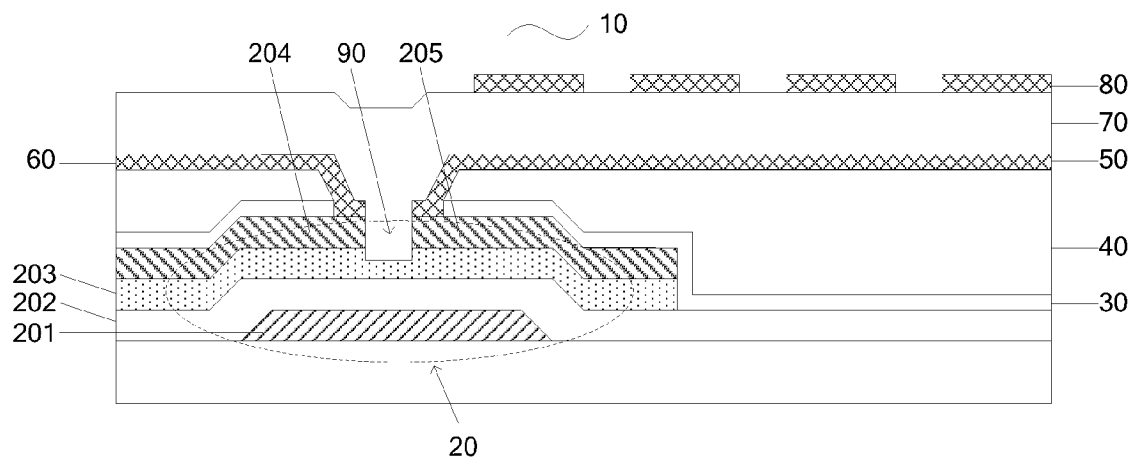
FIG. 6(b) is a fourth schematic structural view of the array substrate provided by the embodiment of the present invention.

S105: as illustrated in FIGS. 6(a) and 6(b), forming a passivation layer 70 on the substrate obtained after the step S104, and forming a common electrode 80 on the substrate provided with the passivation layer 70 by one patterning process.

Thus, an advanced super dimension switch (ADS) array substrate 10 comprising an adhesion layer 30 and a transparent organic insulating layer 40 may be manufactured by five patterning processes.

The adhesion layer 30 and the transparent organic insulating layer 40 include the opening area 90. The common electrode 80 may include a plurality of strip electrodes that are electrically connected together. At this point, the common electrode 80 has a slit structure or a comb structure. The pixel electrode 50 is electrically connected with the drain electrode 205 exposed by the opening area 90.

Moreover, on the basis of the first aspect, optionally, the common electrode 80 arranged on the same layer as and alternately with the pixel electrode 50 may also be formed at the same time at least when the pattern of the source electrode 204 and the drain electrode 205 and the pixel electrode 50 are formed.

Figure 7A:
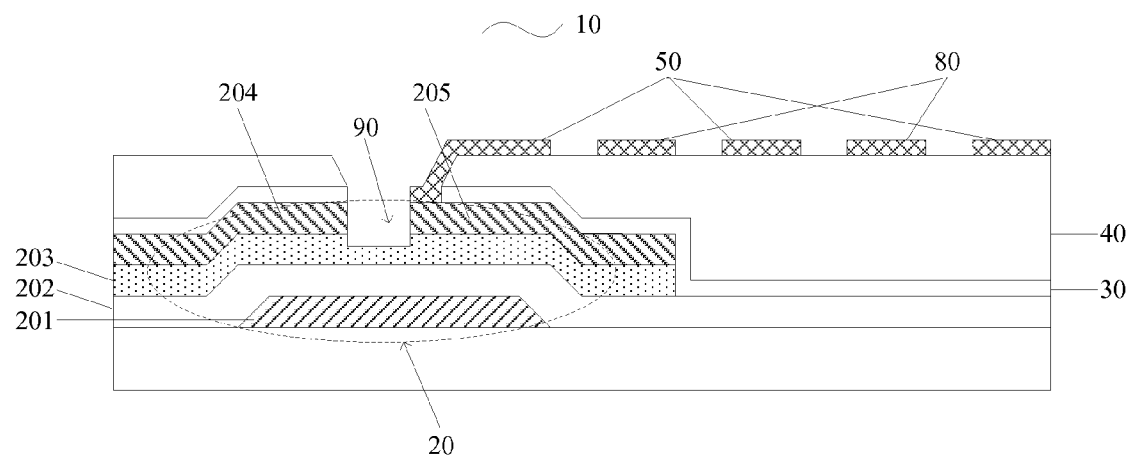
FIG. 7(a) is a fifth schematic structural view of the array substrate provided by the embodiment of the present invention.
Figure 7B:
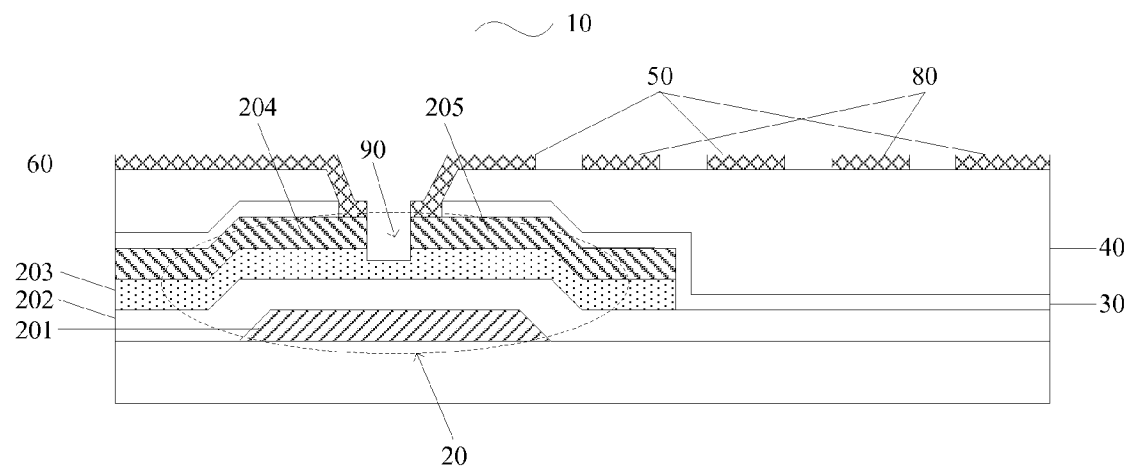
FIG. 7(b) is a sixth schematic structural view of the array substrate provided by the embodiment of the present invention.

Specifically, in the step S104, the common electrode 80, alternately arranged on the same layer as and the pixel electrode 50, as shown in FIGS. 7(a) and 7(b) may also be formed at the same time at least when the pattern of the source electrode 204 and the drain electrode 205 and the pixel electrode 50 electrically connected with the drain electrode 205 are formed by one patterning process.

For instance, the pixel electrode 50 and the common electrode 80 each include a plurality of strip electrodes electrically connected together, and the strip electrodes of the pixel electrode 50 and the strip electrodes of the common electrode 80 are alternately arranged.

Thus, an in-plane switching (IPS) array substrate 10 comprising an adhesion layer 30 and a transparent organic insulating layer 40 may be manufactured by four pattering processes.

Second Aspect

Optionally, before the process of at least forming the pattern of the source electrode 204 and the drain electrode 205 and the pixel electrode 50 and after the process of forming the adhesion layer 30 and the transparent organic insulating layer 40 including the opening area 90, the method may further comprise: forming a common electrode 80 on the substrate provided with the transparent organic insulating layer 40 by one patterning process; and forming a passivation layer film on the substrate provided with the common electrode 80, and forming a passivation layer 70 including the opening area 90 by one patterning process.

On this basis, one embodiment of the method for manufacturing the array substrate may be conducted as follows.

S201: as illustrated in FIG. 2, forming a pattern of a gate electrode 201 on a base substrate by one patterning process, and forming a gate insulating layer 202 on the substrate provided with the pattern of the gate electrode 201.

When the gate electrode 201 is formed, a gate line, a gate line lead and the like are also formed. Of course, a common electrode line may also be formed.

S202: as illustrated in FIG. 2, forming an active layer film and a source/drain metal layer film on the substrate obtained after the step S201, and forming a first pattern 20a and a second pattern 20b disposed on the first pattern 20a by one patterning process, in which the first pattern 20a corresponds to a pattern of a semiconductor active layer 203 and the second pattern 20b corresponds to a source electrode 204 and a drain electrode 205 to be formed.

In the case where the active layer film, for instance, includes an amorphous silicon film and an n+ amorphous silicon film, the first pattern 20a corresponds to the pattern of the semiconductor active layer 203 to be formed. In the case where the active layer film, for instance, includes a metal oxide semiconductor film, the first pattern 20a is the pattern of the semiconductor active layer 203.

S203: as illustrated in FIG. 3, forming an adhesion layer film 300 and a transparent organic insulating layer film 400 on the substrate obtained after the step S202; and forming an opening area 90 in both the adhesion layer film 300 and the transparent organic insulating layer film 400 by one patterning process, and obtaining an adhesion layer 30 and a transparent organic insulating layer 40 as shown in FIG. 4.

The opening area 90 corresponds to a gap between the source electrode 204 and the drain electrode 205 to be formed. The minimum width of the opening area 90 is greater than the width of the gap between the source electrode 204 and the drain electrode 205. The drain electrode 205 is at least exposed by the opening area 90.

Figure 8:
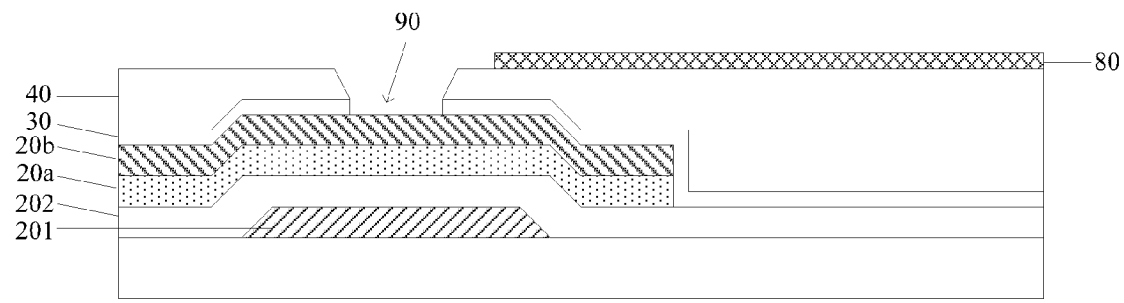
FIG. 8 is a first schematic diagram illustrating a process for forming a common electrode, in the method provided by the embodiment of the present invention.

S204: as illustrated in FIG. 8, forming a common electrode 80 on the substrate obtained after the step S203 by one patterning process.

Figure 9:
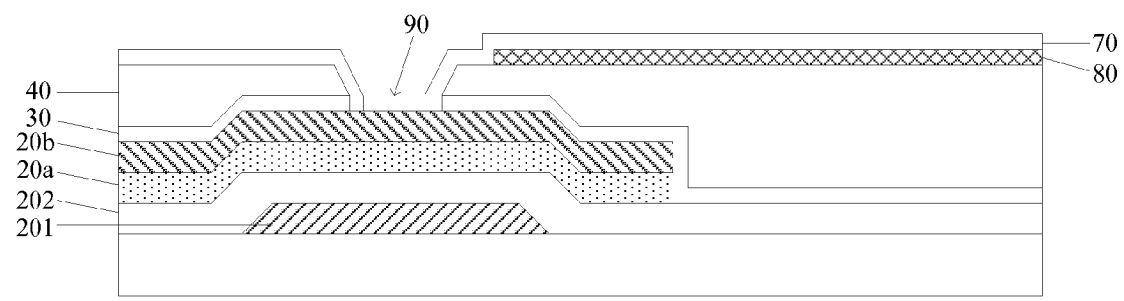
FIG. 9 is a second schematic diagram illustrating the process for forming the opening area, in the method provided by the embodiment of the present invention.

S205: forming a passivation layer film on the substrate obtained after the step S204, forming the opening area 90 by one patterning process, and obtaining a passivation layer 70 as shown in FIG. 9.

Herein, the dimension of the opening area 90 disposed on the passivation layer 70 may be the same as or different from that of the opening area 90 disposed on the adhesion layer 30 and the transparent organic insulating layer 40 and may be determined by a specific process, as long as the opening area 90 corresponds to the gap between the source electrode 204 and the drain electrode 205 to be formed and the drain electrode 205 is at least exposed by the opening area 90.

Figure 10A:
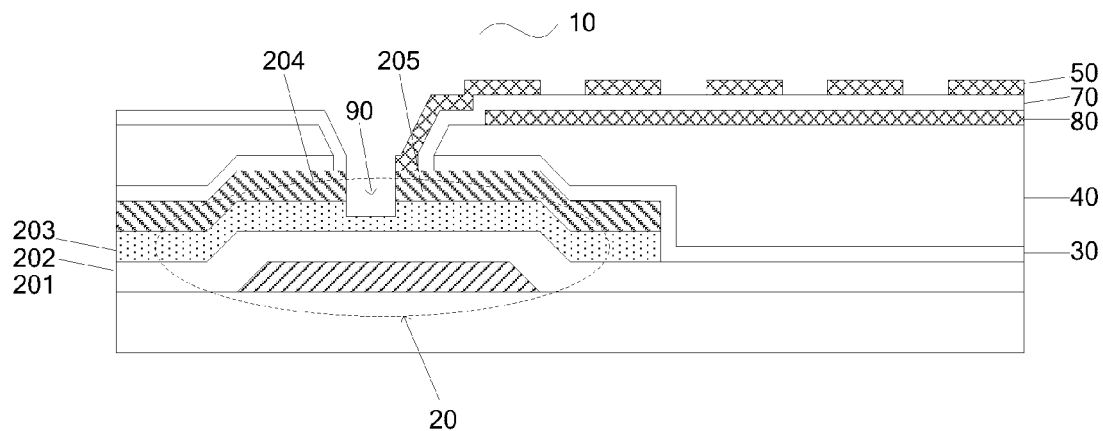
FIG. 10(a) is a seventh schematic structural view of the array substrate provided by the embodiment of the present invention.
Figure 10B:
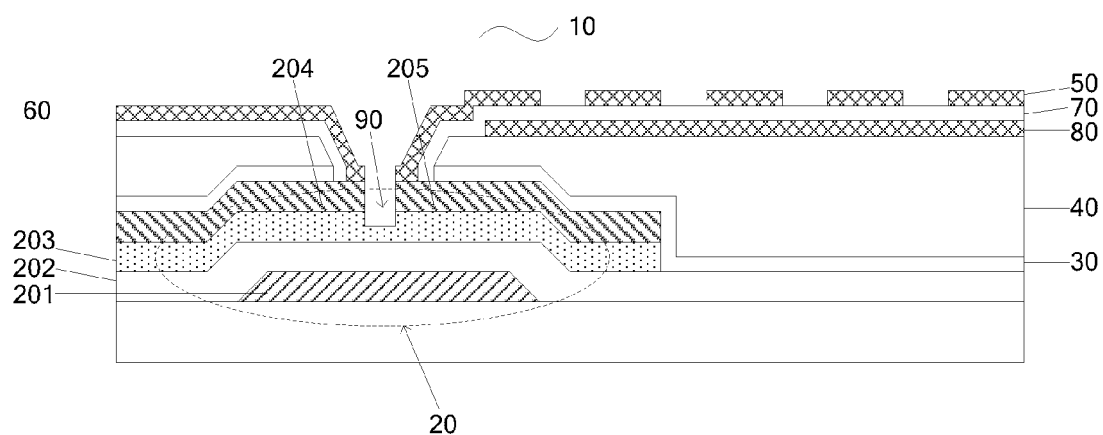
FIG. 10(b) is an eighth schematic structural view of the array substrate provided by the embodiment of the present invention.

S206: forming a transparent conductive film on the substrate obtained after the step S205, and as illustrated in FIGS. 10(a) and 10(b), at least forming a pattern of the source electrode 204 and the drain electrode 205 and a pixel electrode 50 electrically connected with the drain electrode 205 by one patterning process.

Herein, in the case where the active layer film includes an amorphous silicon film and an n+ amorphous silicon film, as illustrated in FIGS. 10(a) and 10(b), the semiconductor active layer 203 is also formed at the same time when the pattern of the source electrode 204 and the drain electrode 205 and the pixel electrode 50 are formed.

Moreover, in the step, as illustrated in FIG. 10(b), the transparent electrode retained pattern 60 may be also formed at the same time when the semiconductor active layer 203, the pattern of the source electrode 204 and the drain electrode 205 and the pixel electrode 50 are formed by one patterning process. The transparent electrode retained pattern 60 at least corresponds to the source electrode 204, is disposed on the source electrode 204, and is electrically connected with the source electrode 204 exposed by the opening area 90.

In addition, when the pattern of the source electrode 204 and the drain electrode 205 is formed, not only the source electrode 204 and the drain electrode 205 are formed but also a data line is formed at the same time.

On this basis, the method may further comprise: forming a through hole for connecting the data line and the transparent electrode retained pattern 60 in the adhesion layer film 300 and the transparent organic insulating layer film 400 formed in the step S203 and in the passivation layer film formed in the step S205. The transparent electrode retained pattern 60 corresponds to both the source electrode 204 and the data line and is electrically connected with the data line via the through hole formed over the data line.

Thus, for instance, after the data line is disconnected, the data line may be connected with the source electrode 204 through the transparent electrode retained pattern 60 corresponding to the data line.

According to the steps S201 to S206 in the above embodiment, an ADS array substrate 10 comprising an adhesion layer 30 and a transparent organic insulating layer 40 can be manufactured by six patterning processes.

The adhesion layer 30, the transparent organic insulating layer 40 and the passivation layer all include the opening area 90. The pixel electrode 50 may include a plurality of strip electrodes electrically connected together. At this point, for instance, the pixel electrode 50 has a slit structure or a comb structure. The pixel electrode 50 is electrically connected with the drain electrode 205 exposed by the opening area 90.

Third Aspect

Optionally, before the process of at least forming the pattern of the source electrode 204 and the drain electrode 205 and the pixel electrode 50, the method may further comprise: forming a common electrode 80 by one patterning process, and forming a passivation layer film on the substrate provided with the common electrode 80.

One example of the process of forming the adhesion layer 30, the transparent organic insulating layer 40 and the passivation layer 70 on the substrate provided with the second pattern 20b is conducted as follows: before the process of forming the common electrode 80 and the passivation layer film, forming an adhesion layer film 300 and a transparent organic insulating layer film 400 in sequence on the substrate provided with the second pattern 20b, performing one patterning process on the transparent organic insulating layer film 400, and forming the transparent organic insulating layer 40 including the opening area 90; and after the process of forming the common electrode 80 and the passivation layer film, performing one patterning process on the adhesion layer film 300 and the passivation layer film, and forming the adhesion layer 30 and the passivation layer 70 including the opening area 90.

On this basis, one embodiment of the method for manufacturing the array substrate 10 may be conducted as follows.

S301: as illustrated in FIG. 2, forming a pattern of a gate electrode 201 on a base substrate by one patterning process, and forming a gate insulating layer 202 on the substrate provided with the pattern of the gate electrode 201.

When the gate electrode 201 is formed, a gate line, a gate line lead and the like are also formed. Of course, a common electrode line may also be formed.

S302: as illustrated in FIG. 2, forming an active layer film and a source/drain metal layer film on the substrate obtained after the step S301, and forming a first pattern 20a and a second pattern 20b disposed on the first pattern 20a by one patterning process, in which the first pattern 20a corresponds to a pattern of a semiconductor active layer 203 and the second pattern 20b corresponds to a source electrode 204 and a drain electrode 205 to be formed.

In the case where the active layer film, for instance, includes an amorphous silicon film and an n+ amorphous silicon film, the first pattern 20a corresponds to the pattern of the semiconductor active layer 203 to be formed. In the case where the active layer film, for instance, includes a metal oxide semiconductor film, the first pattern 20a is the pattern of the semiconductor active layer 203.

Figure 11:
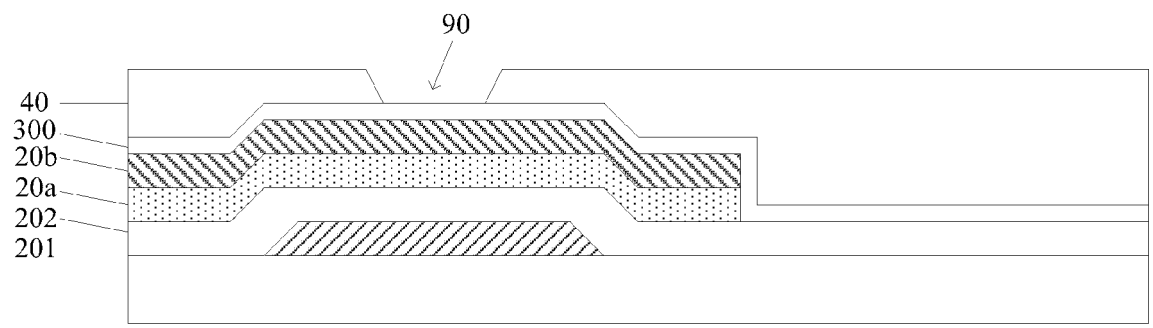
FIG. 11 is a third schematic diagram illustrating the process for forming the opening area, in the method provided by the embodiment of the present invention.

S303: as illustrated in FIG. 3, forming an adhesion layer film 300 and a transparent organic insulating layer film 400 on the substrate obtained after the step S302; and forming an opening area 90 in the transparent organic insulating layer film 400 by one patterning process, and obtaining a transparent organic insulating layer 40 as shown in FIG. 11.

Figure 12:
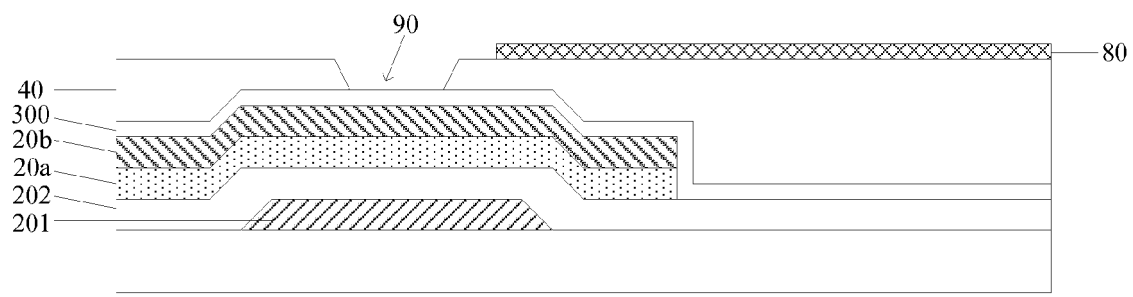
FIG. 12 is a second schematic diagram illustrating the process for forming the common electrode, in the method provided by the embodiment of the present invention.

S304: as illustrated in FIG. 12, forming a common electrode 80 on the substrate obtained after the step S303 by one patterning process.

Figure 13:
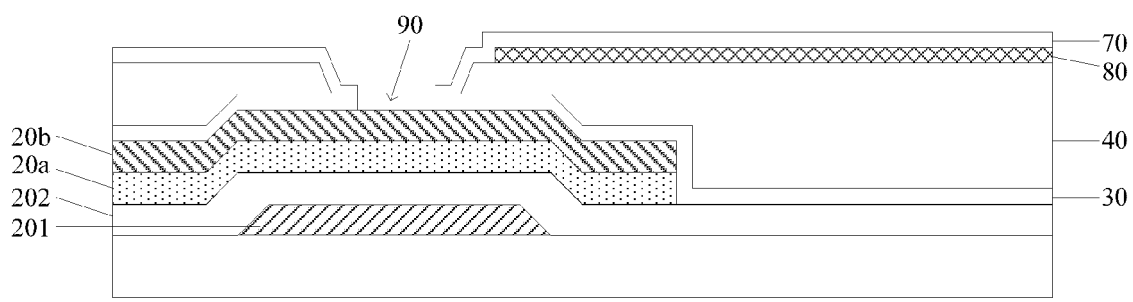
FIG. 13 is a fourth schematic diagram illustrating the process for forming the opening area, in the method provided by the embodiment of the present invention.

S305: forming a passivation layer film on the substrate obtained after the step S304, forming the opening area 90 in the adhesion layer film 300 and the passivation layer film by one patterning process, and obtaining an adhesion layer 30 and a passivation layer 70 as shown in FIG. 13.

The opening area 90 corresponds to a gap between the source electrode 204 and the drain electrode 205 to be formed. The minimum width of the opening area 90 is greater than the width of the gap between the source electrode 204 and the drain electrode 205. The drain electrode 205 is at least exposed by the opening area 90.

As the passivation layer film and the adhesion layer film 300 may be prepared by the same material, in the step, the passivation layer film and the adhesion layer film 300 may be etched with the same etching liquid.

Figure 14A:
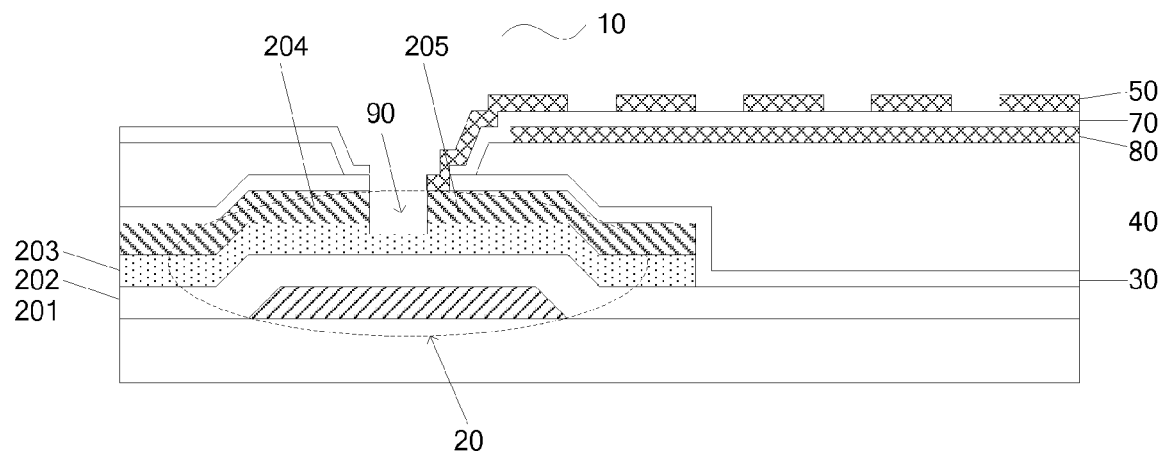
FIG. 14(a) is a ninth schematic structural view of the array substrate provided by the embodiment of the present invention.
Figure 14B:
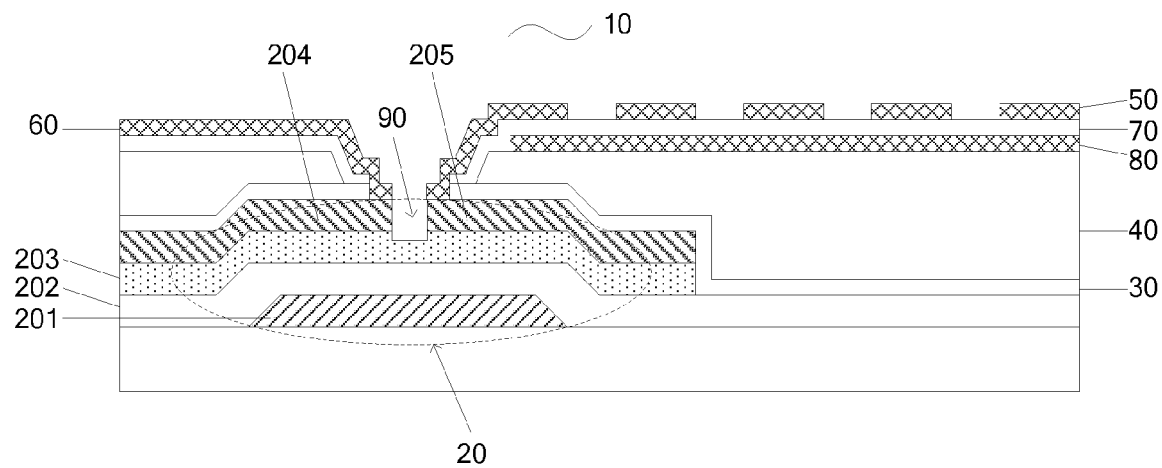
FIG. 14(b) is a tenth schematic structural view of the array substrate provided by the embodiment of the present invention.

S306: forming a transparent conductive film on the substrate obtained after the step S305, and as illustrated in FIGS. 14(a) and 14(b), at least forming a pattern of the source electrode 204 and the drain electrode 205 and a pixel electrode 50 electrically connected with the drain electrode 205 by one patterning process.

In the case where the active layer film includes an amorphous silicon film and an n+ amorphous silicon film, as illustrated in FIGS. 14(a) and 14(b), the semiconductor active layer 203 is also formed at the same time when the pattern of the source electrode 204 and the drain electrode 205 and the pixel electrode 50 are formed.

Moreover, in the step, as illustrated in FIG. 14(b), the transparent electrode retained pattern 60 may also be formed at the same when the semiconductor active layer 203, the pattern of the source electrode 204 and the drain electrode 205 and the pixel electrode 50 are formed by one patterning process. The transparent electrode retained pattern 60 at least corresponds to the source electrode 204, is disposed on the source electrode 204, and is electrically connected with a portion of the source electrode 204 exposed by the opening area 90.

In addition, when the pattern of the source electrode 204 and the drain electrode 205 is formed, not only the source electrode 204 and the drain electrode 205 are formed but also a data line is formed at the same time.

On this basis, the method may further comprise: forming a through hole for connecting the data line and the transparent electrode retained pattern 60 in the transparent organic insulating layer 400 formed in the step S303 and the adhesion layer film 300 and in the passivation layer film formed in the step S305. The transparent electrode retained pattern 60 corresponds to both the source electrode 204 and the data line and is electrically connected with the data line via the through hole formed on the data line.

Thus, for instance, after the data line is disconnected, the data line may be connected with the source electrode 204 through the transparent electrode retained pattern 60 corresponding to the data line.

According to the steps S301 to S306 in the above embodiment, an ADS array substrate 10 comprising an adhesion layer 30 and a transparent organic insulating layer 40 may be manufactured by six patterning processes.

It should be noted that: in the above aspects, when the pattern of the source electrode 204 and the drain electrode 205 and the pixel electrode are at least formed by one patterning process, because the transparent conductive layer is disposed on the source/drain metal layer, in the etching process, the pixel electrode 50 in the upper layer will be formed at first and hence the source electrode 204 and the drain electrode 205 disposed in the lower layer will be formed. Therefore, the distance of the gap between the source electrode 204 and the drain electrode 205 may be controlled by the control of the distance between the pixel electrode 50 and the transparent electrode retained pattern 60. In addition, in the steps S104, S206 and S306, the transparent electrode retained pattern 60 is also preferably formed in the embodiment of the present invention when the semiconductor active layer 203, the pattern of the source electrode 204 and the drain electrode 205, and the pixel electrode 50 are formed.

In addition, in the above aspects and the accompanying drawings, description is conducted by taking the case that the semiconductor active layer 203 includes an amorphous silicon film and an n+ amorphous silicon film as an example. But the embodiment of the present invention is not limited thereto. The semiconductor active layer 203, for instance, may also be a metal oxide semiconductor active layer. In this case, the process of forming the first pattern 20a and the second pattern 20b disposed on the first pattern 20a by one patterning process includes: forming the semiconductor active layer 203 and the second pattern 20b disposed on the semiconductor active layer 203 by one patterning process.

The embodiment of the present invention further provides an array substrate 10 manufactured by the above method. As illustrated in FIGS. 5(a) and 5(b), the array substrate 10 comprises a thin film transistor (TFT) 20, a pixel electrode 50 and a pattern layer disposed between the source electrode 204 and the drain electrode 205 of the TFT 20 and the pixel electrode 50. The pattern layer includes an opening area 90 corresponding to a gap between the source electrode 204 and the drain electrode 205. The minimum width of the opening area 90 is greater than the width of the gap between the source electrode 204 and the drain electrode 205. The drain electrode 205 of the TFT 20 is at least exposed by the opening area 90. The pixel electrode 50 is electrically connected with the drain electrode 205 exposed by the opening area 90.

It should be noted that: firstly, the minimum width L of the opening area 90 is greater than the width 1 of the gap between the source electrode 204 and the drain electrode 205, so that one portion of the drain electrode 205 of the TFT 20 can be at least exposed. Whether one portion of the source electrode 204 of the TFT 20 is at least exposed by the opening area 90 may be designed according to the actual structure. No limitation will be given here.

Secondly, no limitation will be given to the type of the TFT 20 in the array substrate 10, but the embodiment of the present invention preferably adopts a bottom-gate TFT 20 in consideration of the difficulty of the manufacturing process. Herein, the bottom-gate TFT 20 refers to a TFT in which at least one gate electrode 201 is disposed in an upper layer while the source electrode 204 and the drain electrode 205 are disposed in a lower layer.

Optionally, the pattern layer may include a transparent organic insulating layer 40. Moreover, the pattern layer may further include an adhesion layer 30 disposed beneath the transparent organic insulating layer 40. Herein, the adhesion layer 30 is configured to increase the bonding strength between the transparent organic insulating layer 40 and the source/drain metal layer. The transparent organic insulating layer 40 not only can increase the surface flatness of the array substrate 10 but also can reduce the parasitic capacitance of the source electrode 205 or the data line with the pixel electrode 50.

Moreover, optionally, when the embodiment of the present invention is used as an organic light-emitting diode (OLED) device, the array substrate 10 may further comprise an organic emission layer and a cathode layer disposed on the pixel electrode 50 in sequence. At this point, the pixel electrode 50 may also be referred to as a cathode layer. Of course, the array substrate 10 may further comprise other functional structures of the OLED device, e.g., an electron transport layer and a hole transport layer.

Or moreover, optionally, as illustrated in FIGS. 6(a) and 6(b), the array substrate 10 may further comprise a passivation layer 70 and a common electrode 80 disposed on the pixel electrode 50 in sequence. Herein, both the adhesion layer 30 and the transparent organic insulating layer 40 include the opening area 90.

At this point, for instance, the common electrode 80 disposed on the upper layer may include a plurality of strip electrodes electrically connected together and has a slit structure or a comb structure. For instance, the pixel electrode disposed on the lower layer may be a plate electrode and may also include a plurality of electrically connected strip electrodes.

Optionally, as illustrated in FIGS. 10(a), 10(b), 14(a) and 14(b), the array substrate 10 may further comprise a common electrode 80 and a passivation layer 70 disposed in sequence between the transparent organic insulating layer 40 and the pixel electrode 50. The adhesion layer 30, the transparent organic insulating layer 40 and the passivation layer all include the opening area 90.

At this point, for instance, the pixel electrode 50 disposed on the upper layer may include a plurality of strip electrodes electrically connected together and has a slit structure or a comb structure; and the common electrode 80 disposed in the lower layer may be a plate electrode or may include a plurality of strip electrodes electrically connected together.

Optionally, as illustrated in FIGS. 7(a) and 7(b), the array substrate 10 may further comprise a common electrode 80 arranged on the same layer as and alternately with the pixel electrode 50. Both the adhesion layer 30 and the transparent organic insulating layer 40 include the opening area.

At this point, for instance, both the pixel electrode 50 and the common electrode 80 may include a plurality of electrically connected strip electrodes. Moreover, the strip electrodes of the pixel electrode 50 and the strip electrodes of the common electrode 80 are alternately arranged.

In the array substrate provided by one embodiment of the present invention, both the common electrode 80 and the pixel electrode 50 are arranged on the array substrate. A multi-dimensional electric field is formed by electric fields generated by edges of slit electrodes in the same plane and an electric field generated between a slit electrode layer and a plate electrode layer, so that liquid crystal molecules in all the alignments between slit electrodes in a liquid crystal cell and over the electrodes can rotate, and hence the working efficiency of liquid crystals can be improved and the light transmittance can be improved as well. The ADS technology can improve the image quality of a display panel and has the advantages of high resolution, high transmittance, low power consumption, wide viewing angle, high aperture opening ratio, low chromatic aberration, no push Mura and the like.

Moreover, the drain electrode 205 may be at least exposed by the opening area 90, that is to say, the source electrode 204 may also be exposed by the opening area 90. In this case, the array substrate 10 may further comprise a transparent electrode retained pattern 60 arranged on the same layer as the pixel electrode 50. In addition, the transparent electrode retained pattern 60 at least corresponds to the source electrode 204 and is disposed on the source electrode 204. The source electrode 204 of the TFT 20 is exposed by the opening area 90. The transparent electrode retained pattern 60 is electrically connected with the source electrode 204 exposed by the opening area 90.

Herein, the distance of the gap between the source electrode 204 and the drain electrode 205 may be controlled by the control of the distance between the pixel electrode 50 and the transparent electrode retained pattern 60.

On this basis, the array substrate 10 may further comprise a data line. The transparent electrode retained pattern 60 corresponds to both the source electrode 204 and the data line and may also be electrically connected with the data line via a through hole formed on the data line.

On this basis, on one hand, the source electrode 204 is electrically connected with the data line; on the other hand, the transparent electrode retained pattern 60 not only is electrically connected with the source electrode 204 but also is electrically connected with the data line, namely the source electrode 204 may be electrically connected with the data line through the transparent electrode retained pattern 60. Thus, for instance, after the data line is disconnected, the data line may be also connected with the source electrode 204 through the transparent electrode retained pattern 60 corresponding to the data line, and hence the double-safety connection between the source electrode 204 and the data line can be achieved.

Moreover, optionally, the TFT 20 includes a semiconductor active layer 203. The semiconductor active layer 203 may include an amorphous layer and an n+ amorphous silicon layer or may be a metal oxide semiconductor active layer.

Of course, the semiconductor active layer 203 may further include an active layer of another type, e.g., a polysilicon active layer and a low-temperature polysilicon active layer.

The embodiment of the present invention further provides a display device, which comprises the foregoing array substrate 10.

The display device provided by the embodiment of the present invention may be any product or component with display function such as a liquid crystal display (LCD) panel, an OLED device, e-paper, an LCD TV, an LCD, a digital picture frame, a mobile phone and a tablet PC.

Although description has been given in the above embodiments by taking the connection between the drain electrode 205 and the pixel electrode 50 as an example, it should be understood by those skilled in the art that the source electrode 204 may also be connected with the pixel electrode 50 due to the interchangeability of the source electrode 204 and the drain electrode 205 of the TFT in structure and composition, which belongs to equivalent transformations of the above embodiments of the present invention.

The foregoing is only the preferred embodiments of the present invention and not intended to limit the scope of protection of the present invention. The scope of protection of the present invention should be defined by the appended claims.

The invention claimed is:

1. An array substrate, comprising a thin-film transistor (TFT), a pixel electrode, a pattern layer disposed between a source electrode and a drain electrode of the TFT and the pixel electrode, a transparent electrode retained pattern arranged on the same layer as the pixel electrode and a data line, wherein
a first gap is between the source electrode and the drain electrode, a second gap is between the transparent electrode retained pattern and the pixel electrode and an opening area is in the pattern layer corresponding to the first gap and the second gap;
the minimum width of the opening area is greater than a width of the first gap between the source electrode and the drain electrode and at least a portion of the drain electrode of the TFT is exposed by the opening area;

the pixel electrode is electrically connected with the portion of the drain electrode exposed by the opening area;

the transparent electrode retained pattern at least corresponds to the source electrode and is disposed on the source electrode; the source electrode of the TFT is also exposed by the opening area; and the transparent electrode retained pattern is electrically connected with the source electrode exposed by the opening area;

a side surface of the source electrode facing the first gap and a side surface of the drain electrode facing the first gap are exposed through the second gap; and the data line is electrically connected with the transparent electrode retained pattern and the source electrode.

2. The array substrate according to claim 1, wherein the pattern layer includes a transparent organic insulating layer and an adhesion layer disposed beneath the transparent organic insulating layer.

3. The array substrate according to claim 2, further comprising a passivation layer and a common electrode disposed on the pixel electrode in sequence,
wherein both the adhesion layer and the transparent organic insulating layer include the opening area.

4. The array substrate according to claim 2, further comprising a common electrode and a passivation layer disposed between the transparent organic insulating layer and the pixel electrode in sequence,
wherein the adhesion layer, the transparent organic insulating layer and the passivation layer all include the opening area.

5. The array substrate according to claim 2, further comprising a common electrode arranged on a same layer as and alternately with pixel electrode,
wherein both the adhesion layer and the transparent organic insulating layer include the opening area.

6. The array substrate according to claim 1, wherein the TFT includes a semiconductor active layer,
wherein the semiconductor active layer includes an amorphous silicon layer and an n+ amorphous silicon layer; or the semiconductor active layer includes a metal oxide semiconductor active layer.

7. The array substrate according to claim 1, wherein the TFT is a bottom-gate TFT.

8. A display device, comprising the array substrate according to claim 1.

9. A method for manufacturing an array substrate, comprising:
forming a pattern of a gate electrode on a base substrate by one patterning process;
forming a gate insulating layer on the substrate provided with the pattern of the gate electrode;
forming a first pattern and a second pattern disposed on the first pattern by one patterning process on the substrate provided with the gate insulating layer, wherein the first pattern corresponds to a pattern of a semiconductor active layer and the second pattern corresponds to a source electrode and a drain electrode to be formed;
forming a pattern layer including an opening area on the substrate provided with the second pattern, wherein the opening area corresponds to a gap between the source electrode and the drain electrode to be formed, the minimum width of the opening area is greater than a width of the gap between the source electrode and the drain electrode, and a portion of the drain electrode is exposed by the opening area;

forming a transparent conductive film on the substrate provided with the pattern layer; and at least forming a pattern of the source electrode and the drain electrode and a pixel electrode and a transparent electrode retained pattern on the substrate provided with the transparent conductive film by one patterning process to form a first gap between the source electrode and the drain electrode, and a second gap between the transparent electrode retained pattern and the pixel electrode, wherein the first gap and the second gap are corresponding to the opening area; the pixel electrode is electrically connected with the portion of the drain electrode exposed by the opening area, and the transparent electrode retained pattern is electrically connected with a portion of the source electrode exposed by the opening area, wherein a side surface of the source electrode facing the first gap and a side surface of the drain electrode facing the first gap are exposed through the second gap;

a through hole is formed for connecting a data line and the transparent electrode retained pattern; the transparent electrode retained pattern corresponds to both the source electrode and the data line and is electrically connected with the data line via the through hole formed on the data line.

10. The method according to claim 9, wherein the pattern layer includes an adhesion layer and a transparent organic insulating layer.

11. The method according to claim 10, further comprising: before performing the one patterning process of at least forming the pattern of the source electrode and the drain electrode and the pixel electrode,
forming a common electrode by one patterning process; and
forming a passivation layer film on the substrate provided with the common electrode, wherein the adhesion layer, the transparent organic insulating layer and a passivation layer, including the opening area, are formed on the substrate provided with the second pattern.

12. The method according to claim 11, wherein
before the common electrode and the passivation layer film are formed, an adhesion layer film and a transparent organic insulating layer film are formed on the substrate provided with the second pattern in sequence, the transparent organic insulating layer film is subjected to one patterning process, and the transparent organic insulating layer includes the opening area being formed; and
after the common electrode and the passivation layer film are formed, the adhesion layer and the passivation layer, including the opening area, are formed by performing one patterning process on the adhesion layer film and the passivation layer film.

13. The method according to claim 9, wherein a common electrode arranged on a same layer as and alternately with pixel electrode is also formed at the same time when the pixel electrode is formed.

14. The method according to claim 9, wherein a passivation layer is formed on the substrate provided with the pixel electrode; and subsequently, a common electrode is formed on the passivation layer.

15. The method according to claim 10, wherein a common electrode arranged on a same layer as and alternately with pixel electrode is also formed at the same time when the pixel electrode is formed.

16. The method according to claim 10, wherein a passivation layer is formed on the substrate provided with the pixel electrode; and subsequently, a common electrode is formed on the passivation layer.

* * * * *